United States Patent
Ho

(10) Patent No.: US 10,312,612 B2
(45) Date of Patent: Jun. 4, 2019

(54) HIGH-CURRENT CONNECTOR AND HIGH-CURRENT CONNECTION DEVICE

(71) Applicant: Molex, LLC, Lisle, IL (US)

(72) Inventor: Yi-Tse Ho, Taipei (TW)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/981,515

(22) Filed: May 16, 2018

(65) Prior Publication Data

US 2018/0342824 A1 Nov. 29, 2018

(30) Foreign Application Priority Data

May 25, 2017 (CN) ..................... 2017 2 0596469 U

(51) Int. Cl.
| | |
|---|---|
| *H01R 12/00* | (2006.01) |
| *H01R 12/70* | (2011.01) |
| *H01R 12/71* | (2011.01) |
| *H05K 1/18* | (2006.01) |
| *H01R 13/11* | (2006.01) |

(52) U.S. Cl.
CPC ....... *H01R 12/7052* (2013.01); *H01R 12/707* (2013.01); *H01R 12/7064* (2013.01); *H01R 12/71* (2013.01); *H05K 1/184* (2013.01); *H01R 13/111* (2013.01); *H05K 2201/1059* (2013.01); *H05K 2201/10295* (2013.01); *H05K 2201/10333* (2013.01); *H05K 2201/10537* (2013.01)

(58) Field of Classification Search
USPC ................................................. 876/876, 947
See application file for complete search history.

(56) References Cited

U.S. PATENT DOCUMENTS 2,591,007 A * 4/1952 Rench ....................... G06F 3/02
235/61 PK
2,840,794 A * 6/1958 Batcheller .............. H01R 31/00
439/723
(Continued)

FOREIGN PATENT DOCUMENTS

DE 202008005394 U1 7/2008

*Primary Examiner* — Neil Abrams
(74) *Attorney, Agent, or Firm* — Molex, LLC

(57) ABSTRACT

A high-current connector and a high-current connection device, the high-current connection device comprises a circuit board and at least one group of (two) high-current connectors. Each high-current connector comprises a conductive mating member and a conductive combined shunt. The conductive mating member has a main body and an alignment soldering leg, the main body is formed as a columnar body and has a bottom surface and a top surface, the alignment soldering leg integrally extends from the bottom surface and protrudes from the bottom surface. The conductive combined shunt has a base portion combined with the main body and a plurality of shunt pins extending from at least two opposite sides of the base portion, and the plurality of shunt pins are positioned on both sides of the alignment soldering leg. The alignment soldering leg of the high-current connector is inserted into and electrically connected to the middle conductive holes of the circuit board, and the shunt pins of the high-current connector are respectively inserted into and electrically connected to the first conductive holes of the circuit board.

17 Claims, 8 Drawing Sheets

(56) References Cited

U.S. PATENT DOCUMENTS

| | | | | |
|---|---|---|---|---|
| 4,191,440 | A | * | 3/1980 | Schramm ............. H01R 12/585 439/572 |
| 4,425,021 | A | * | 1/1984 | Nicolino ................ H01R 23/10 219/543 |
| 4,645,288 | A | * | 2/1987 | Stursa ................... H01R 24/50 439/581 |
| 4,702,707 | A | * | 10/1987 | Hillbish ............... H01R 12/722 439/745 |
| 4,749,357 | A | * | 6/1988 | Foley ................ H01R 12/7088 439/65 |
| 4,904,192 | A | * | 2/1990 | Holden ............... H01M 2/1055 439/78 |
| 4,959,027 | A | * | 9/1990 | Muzslay ............. F02M 51/005 29/832 |
| 5,055,055 | A | * | 10/1991 | Bakker ............. H01R 13/6315 29/883 |
| 5,158,471 | A | * | 10/1992 | Fedder ............. H01R 12/7088 439/65 |
| 5,174,768 | A | * | 12/1992 | Hewison ................ H01R 9/032 174/51 |
| 5,291,376 | A | * | 3/1994 | Mills ........................ H01R 4/36 174/520 |
| 6,059,600 | A | * | 5/2000 | Vanbesien ............... H01R 13/41 439/378 |
| 6,080,008 | A | * | 6/2000 | Frantz ................. H01R 4/4881 439/441 |
| 6,224,430 | B1 | * | 5/2001 | Kusuda ................ H01R 12/515 439/709 |
| 6,402,566 | B1 | * | 6/2002 | Middlehurst ........ H01R 13/113 439/680 |
| 6,407,652 | B1 | * | 6/2002 | Kan ....................... H01R 24/50 333/260 |
| 6,461,172 | B2 | * | 10/2002 | Ross ....................... H01R 4/34 439/78 |
| 6,461,174 | B1 | * | 10/2002 | Hwang ................ H01R 12/585 439/78 |
| 6,639,154 | B1 | | 10/2003 | Cartier et al. |
| 6,790,104 | B2 | * | 9/2004 | Antaya .................. H01R 13/04 439/83 |
| 6,945,831 | B2 | * | 9/2005 | Pereira ..................... H01R 4/02 29/882 |
| 6,948,984 | B2 | * | 9/2005 | Chen .................. H01R 12/7088 439/660 |
| 7,059,884 | B2 | * | 6/2006 | Hisaeda ................ H01R 13/20 439/329 |
| 7,514,654 | B2 | * | 4/2009 | Okajima ............. B23K 1/0008 219/522 |
| 8,075,322 | B2 | * | 12/2011 | Schwettmann ........ H01R 11/28 439/78 |
| 8,968,010 | B2 | * | 3/2015 | Endo ........................ H01R 4/48 439/82 |
| 9,147,952 | B2 | * | 9/2015 | Kikuchi ............ H01R 12/7082 |
| 9,967,967 | B2 | * | 5/2018 | Schmalbuch ........... H01R 12/53 |
| 10,128,587 | B2 | * | 11/2018 | Ho ........................ H01R 12/58 |
| 2001/0044239 | A1 | * | 11/2001 | Gugliotti ................ H01R 13/44 439/668 |
| 2007/0224842 | A1 | * | 9/2007 | Hoepfner ................. H01R 4/02 439/34 |
| 2018/0342824 | A1 | * | 11/2018 | Ho ...................... H01R 12/7052 |

* cited by examiner

HIGH-CURRENT CONNECTOR AND HIGH-CURRENT CONNECTION DEVICE

RELATED APPLICATIONS

This application claims priority to Chinese Application No. 201720596469.5, filed May 25, 2017, which is incorporated herein by reference in its entirety.

TECHNICAL FIELD

The present disclosure relates to an electrical connector, especially to a high-current connector and a high-current connection device.

BACKGROUND ART

German patent DE202008005394U1 discloses a high-current printed circuit board connector, which comprises a contact socket and a base block having a plurality of pins for being soldered to a circuit board, the base block has an engaging hole, and the contact socket is inserted into the engaging hole in interference-fit and is assembled with the base block in an interference fashion.

When the contact socket is assembled with the base block, the contact socket may create a deviation that deviates from the relative vertical position relative to the base block, which in turn causes the plurality of contact pins of the base block to be more difficult to align with the soldering holes on the circuit board one-by-one, and causes he base block is difficult to mount to the circuit board.

SUMMARY

Therefore, one object of the present disclosure is to provide a high-current connector which is easily align and assembled with a circuit board.

Another object of the present disclosure is to provide a high-current connection device having the aforementioned high-current connector.

Still another object of the present disclosure is to provide a high-current connection device which can further increase in the shunt paths of the high-current connector so as to increase multiple-path distribution of current.

Therefore, in some embodiments, a high-current connector of the present disclosure comprises a conductive mating member and a conductive combined shunt. The conductive mating member has a main body and one alignment soldering leg, the main body is formed as a columnar body and has a bottom surface and a top surface opposite to the bottom surface, the alignment soldering leg integrally extends from the bottom surface and protrudes from the bottom surface. The conductive combined shunt has a base portion combined with the main body and a plurality of shunt pins extending from at least two opposite sides of the base portion, and the plurality of shunt pins are positioned on both sides of the alignment soldering leg.

In some embodiments, the main body further has a central axis passing through the bottom surface and the top surface and is formed as an axisymmetric columnar body with respect to the central axis, the alignment soldering leg integrally extends from the bottom surface along the central axis.

In some embodiments, the conductive mating member further has a ring flange adjacent to the bottom surface and integrally protruding outwardly from the main body in a radial direction and an engaging portion adjacent to the ring flange and integrally protruding outwardly from the main body in the radial direction and positioned between the ring flange and the top surface, the base portion of the conductive combined shunt has an engaging hole which cooperates with the engaging portion and into which the engaging portion is inserted so that the conductive combined shunt and the conductive mating member are engaged and fixed in interference fit.

In some embodiments, the engaging portion is formed as an annular comb.

In some embodiments, the ring flange connects with the engaging portion, and an outer diameter of the ring flange is larger than an outer diameter of the engaging portion so that a portion of the ring flange protruding from the engaging portion can prevent the base portion of the conductive combined shunt from moving toward the bottom surface.

In some embodiments, the main body further has a slot recessed from the top surface toward the bottom surface, the conductive mating member further has a plurality of elastic terminals provided in the slot of the main body.

Therefore, in some embodiments, a high-current connection device of the present disclosure comprises a circuit board and at least one group of high-current connectors, each group has two high-current connectors. The circuit board has at least two mounting regions, each mounting region being provided with a middle conductive hole and a plurality of first conductive holes positioned on at least two sides of the middle conductive hole. Each high-current connector comprises a conductive mating member and a conductive combined shunt. The conductive mating member has a main body and an alignment soldering leg, the main body is formed as a columnar body and has a bottom surface and a top surface opposite to the bottom surface, the alignment soldering leg integrally extends from the bottom surface and protrudes from the bottom surface. The conductive combined shunt has a base portion combined with the main body and a plurality of shunt pins extending from at least two opposite sides of the base portion, and the plurality of shunt pins are positioned on both sides of the alignment soldering leg. The two high-current connectors are respectively provided in the two mounting regions, and the alignment soldering leg of each high-current connector is inserted into and electrically connected to the middle conductive hole of the corresponding mounting region, and the shunt pins of each high-current connector are respectively inserted into and electrically connected to the first conductive holes of the corresponding mounting region.

In some embodiments, each mounting region is further provided with a plurality of second conductive holes surrounding a periphery of the middle conductive hole and positioned between the middle conductive hole and the plurality of first conductive holes and a conductive medium provided on a surface of the mounting region, the plurality of second conductive holes are electrically connected with the corresponding high-current connector via the conductive medium.

In some embodiments, the conductive medium comprises a conductive pad provided on the surface of the mounting region in advance.

In some embodiments, the conductive medium comprises a solder layer coated on the surface of the mounting region during a soldering process.

In some embodiments, the conductive medium comprises a conductive pad provided on the surface of the mounting region in advance and a solder layer coated on the surface of the conductive pad during a soldering process.

In some embodiments, the conductive medium on the surface of each mounting region electrically connects the middle conductive hole, the plurality of first conductive holes and the plurality of second conductive holes in the mounting region together.

In some embodiments, the main body of each high-current connector further has a central axis passing through the bottom surface and the top surface and is formed as an axisymmetric columnar body with respect to the central axis, the alignment soldering leg integrally extends from the bottom surface along the central axis.

In some embodiments, the conductive mating member of each high-current connector further has a ring flange adjacent to the bottom surface and integrally protruding outwardly from the main body in a radial direction and an engaging portion adjacent to the ring flange and integrally protruding outwardly from the main body in the radial direction and positioned between the ring flange and the top surface, the base portion of the conductive combined shunt of each high-current connector has an engaging hole which cooperates with the engaging portion and into which the engaging portion is inserted so that the conductive combined shunt and the conductive mating member are engaged and fixed in interference fit.

In some embodiments, the engaging portion of each high-current connector is formed as an annular comb.

In some embodiments, the ring flange connects with the engaging portion, and an outer diameter of the ring flange is larger than an outer diameter of the engaging portion so that a portion of the ring flange protruding from the engaging portion can prevent the base portion of the conductive combined shunt from moving toward the bottom surface.

In some embodiments, the main body of each high-current connector further has a slot recessed from the top surface toward the bottom surface, the conductive mating member further has a plurality of elastic terminals provided in the slot of the main body.

The present disclosure has the following effect: the high-current connector and the circuit board can be positioned relative to each other by inserting the alignment soldering leg in the middle conductive hole, thus it is convenient to for the plurality of shunt pins to align with and insert into the plurality of first conductive holes respectively, so that the high-current connector can be easily aligned and assembled on the circuit board. The shunt paths of the high-current connector can be further increased via the plurality of the second conductive holes so as to increase the multiple-path distribution of current.

BRIEF DESCRIPTION OF THE DRAWINGS

Other features and effects of the present disclosure will be apparent from the embodiments with reference to figures, in which.

DETAILED DESCRIPTION OF THE PREFERRED EMBODIMENTS

Figure 1:
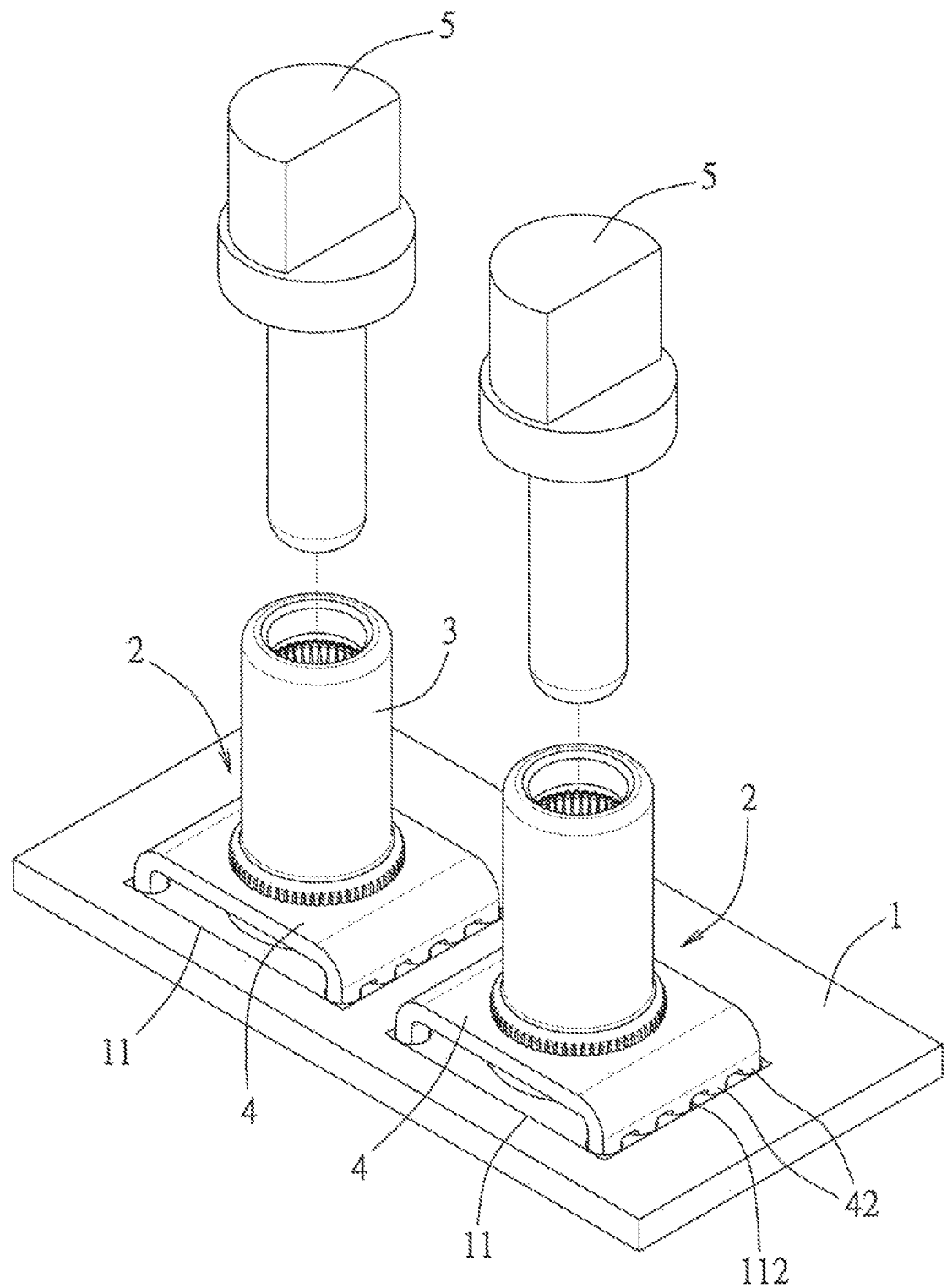
FIG. 1 is an exploded perspective view of an embodiment of a high-current connection device of the present disclosure and a mating connector.
Figure 2:
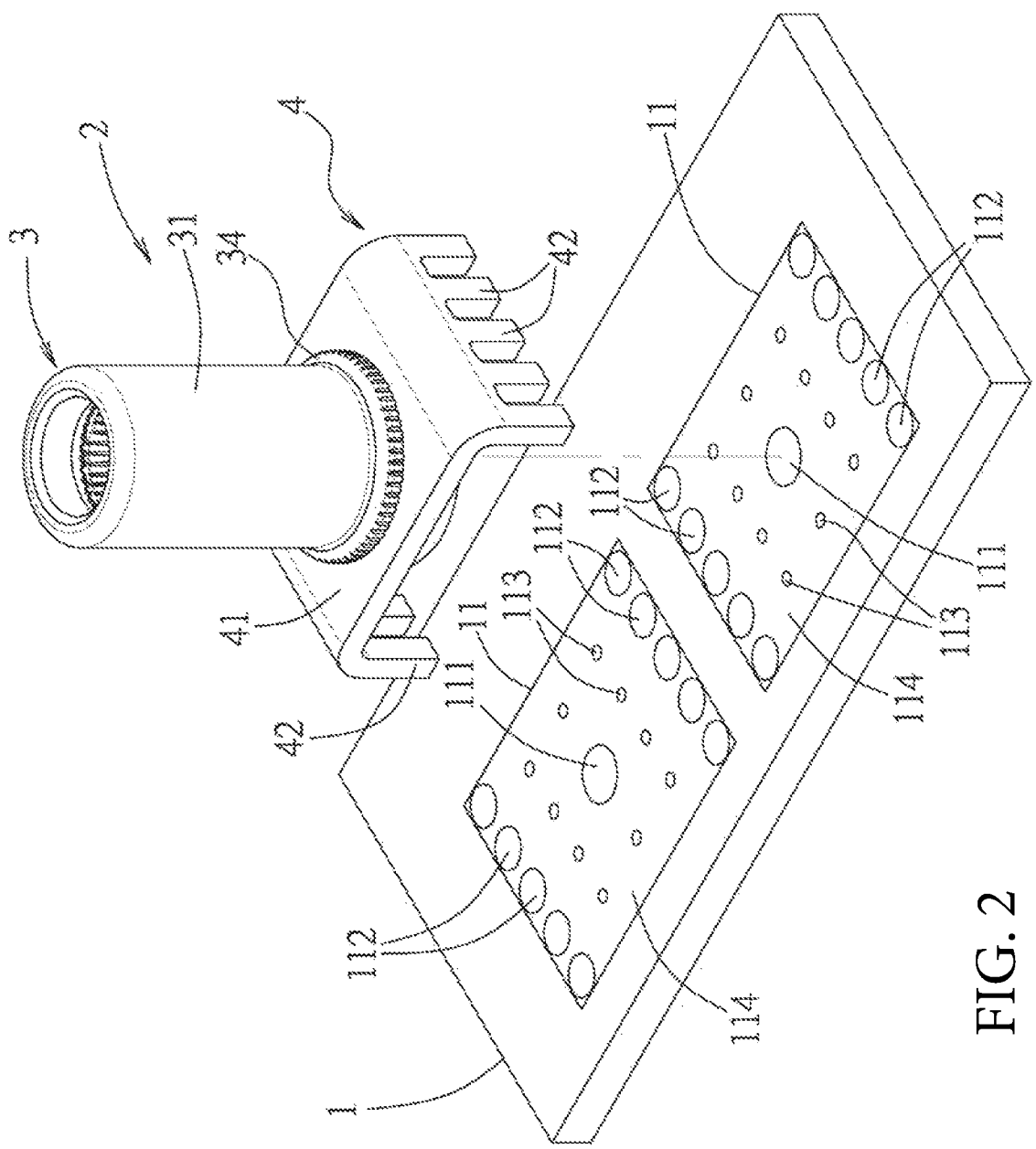
FIG. 2 is an exploded perspective view of the embodiment.

Referring to FIG. 1 and FIG. 2, an embodiment of a high-current connection device of the present disclosure comprises a circuit board 1 and a group of high-current connectors 2. Generally, one group of high-current connectors 2 has two high-current connectors 2, which are used for current outflow and current inflow respectively, or in other words, which are positive pole and negative pole respectively. In the illustrated embodiment, only one group of high-current connector 2 is described as an example. In a modified embodiment, multiple groups of high-current connectors 2 may be provided on the same circuit board 1. For the sake of convenient description, only two high-current connectors 2 are shown in FIG. 1 and only one high-current connector 2 is shown in the other figures.

Figure 3:
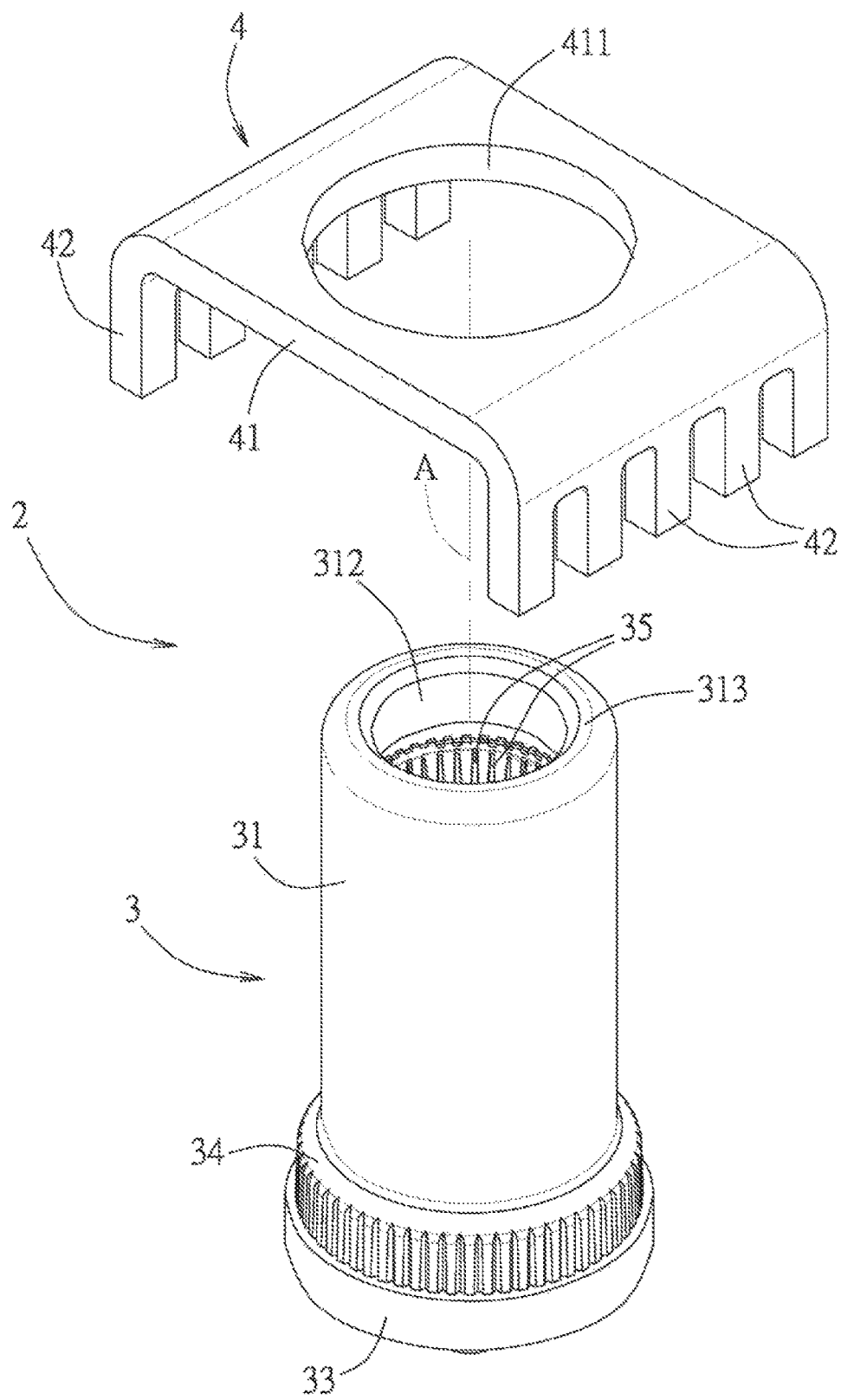
FIG. 3 is an exploded perspective view of a high-current connector of the embodiment.
Figure 4:
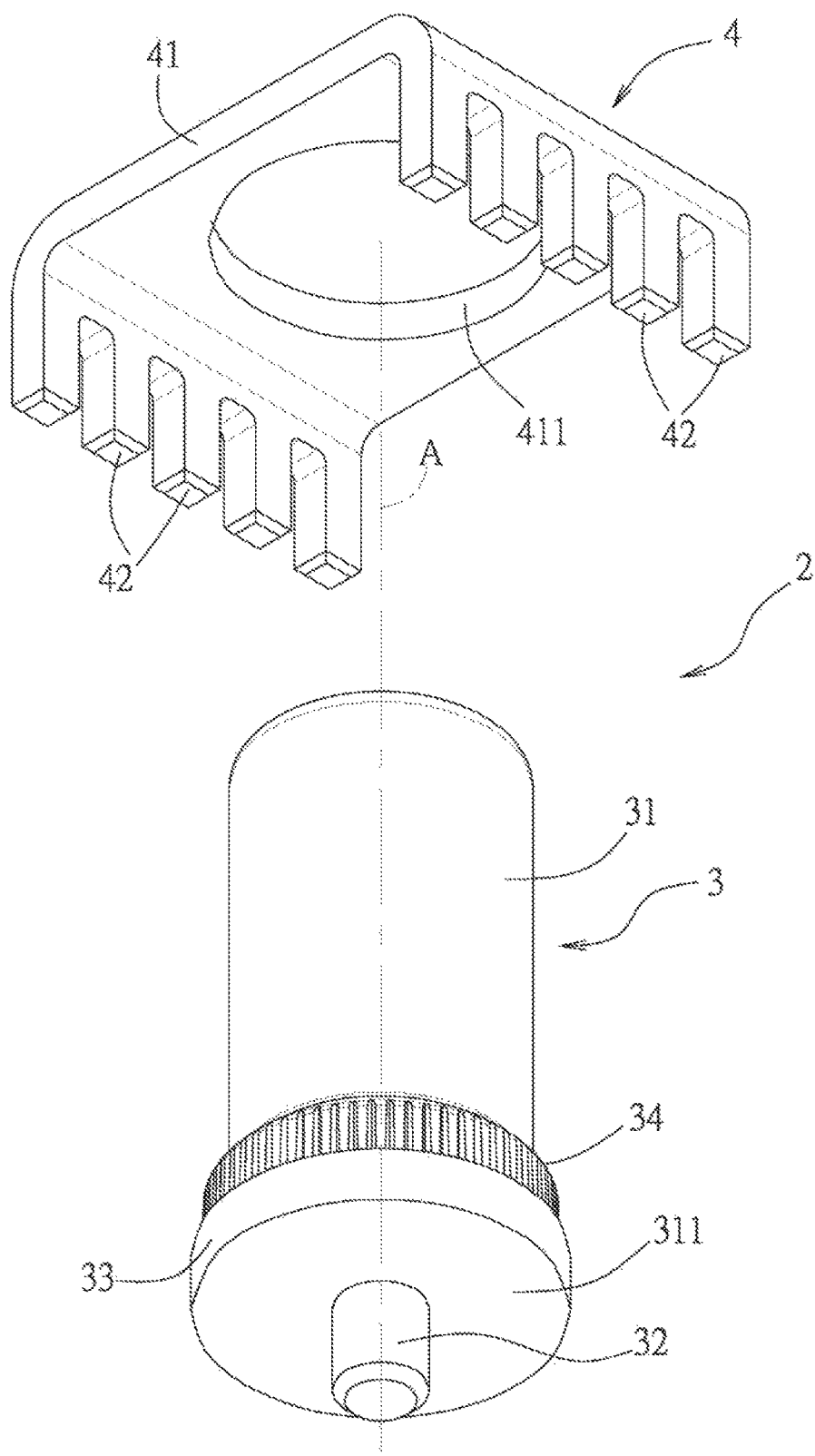
FIG. 4 is a view of FIG. 3 viewed from another angle.
Figure 5:
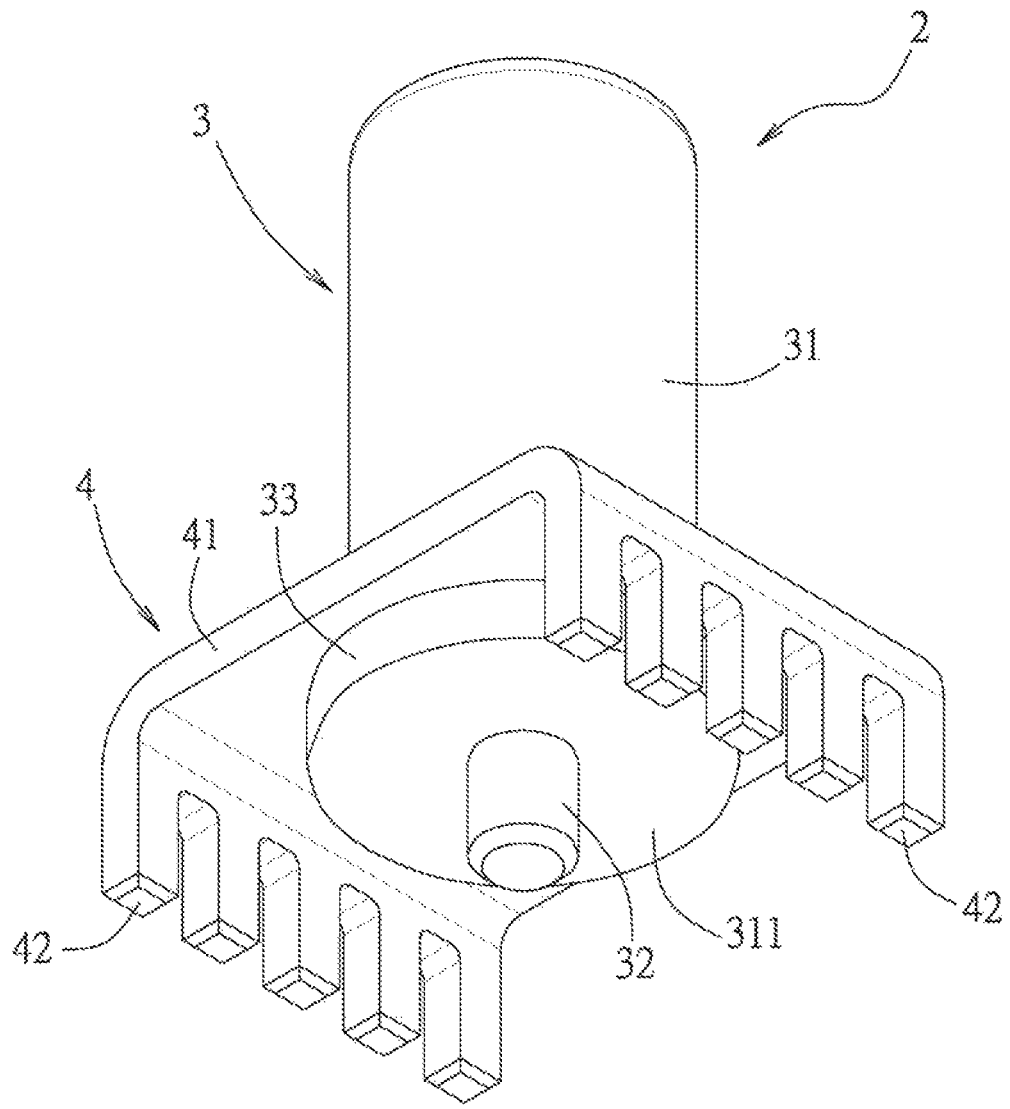
FIG. 5 is a perspective view of the high-current connector of the embodiment.
Figure 6:
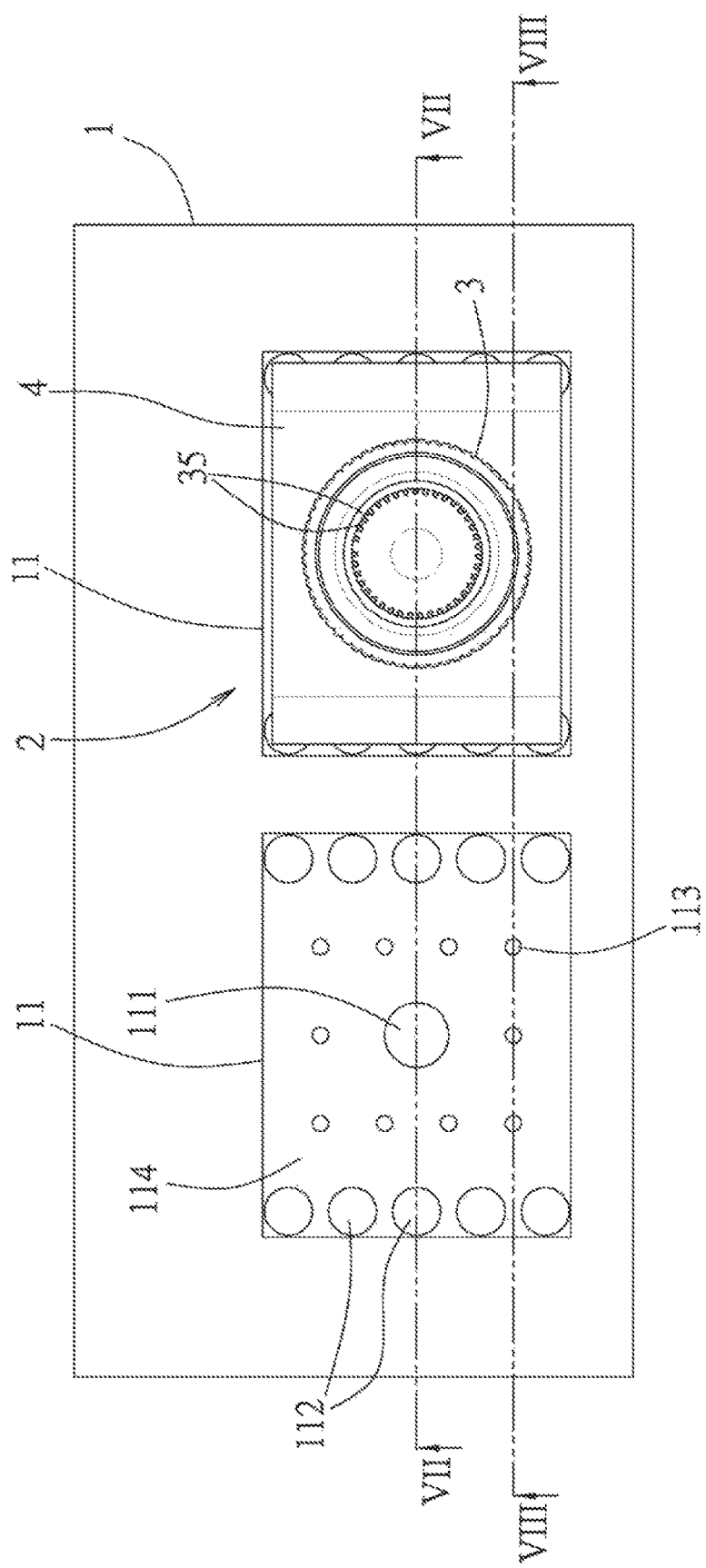
FIG. 6 is a top view of the embodiment.
Figure 7:
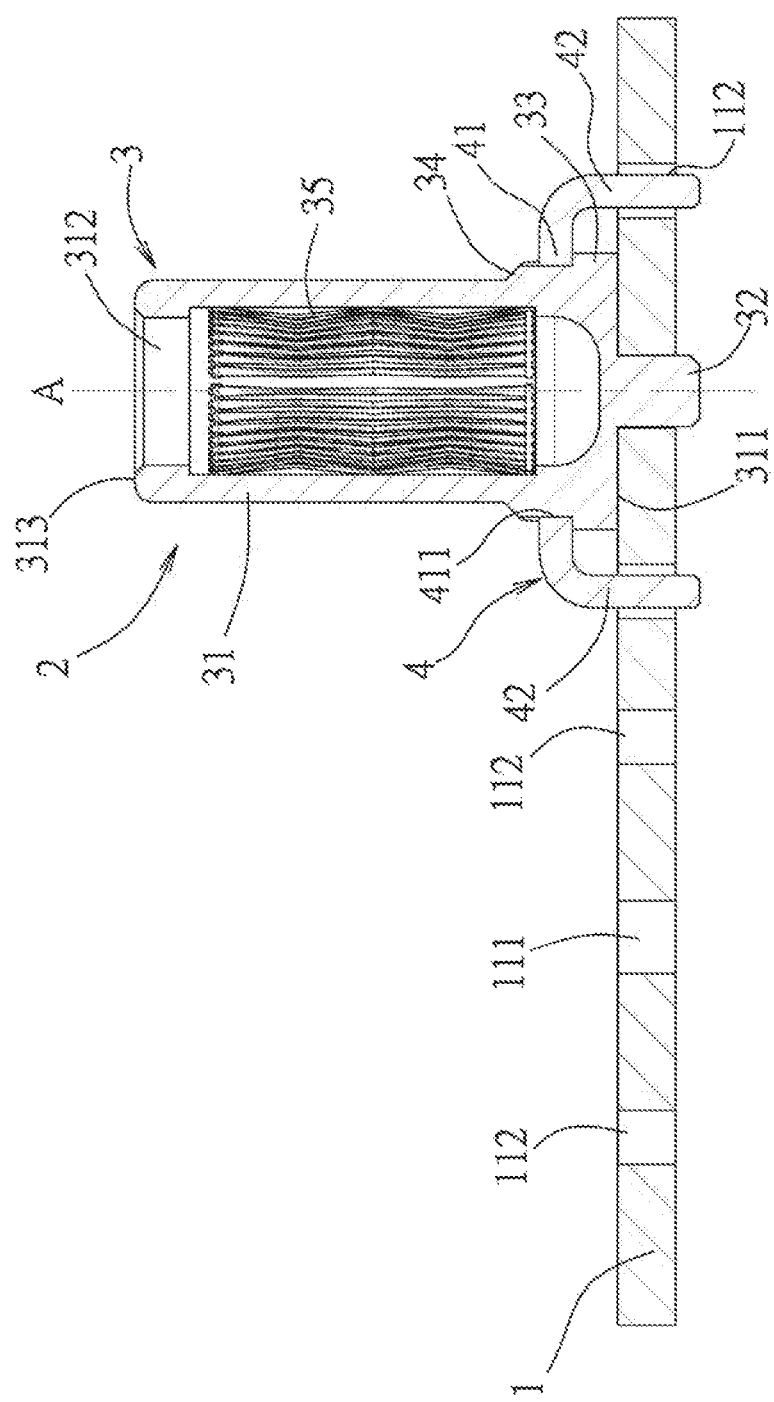
FIG. 7 is a cross sectional view taken along a line VII-VII of FIG. 6.
Figure 8:
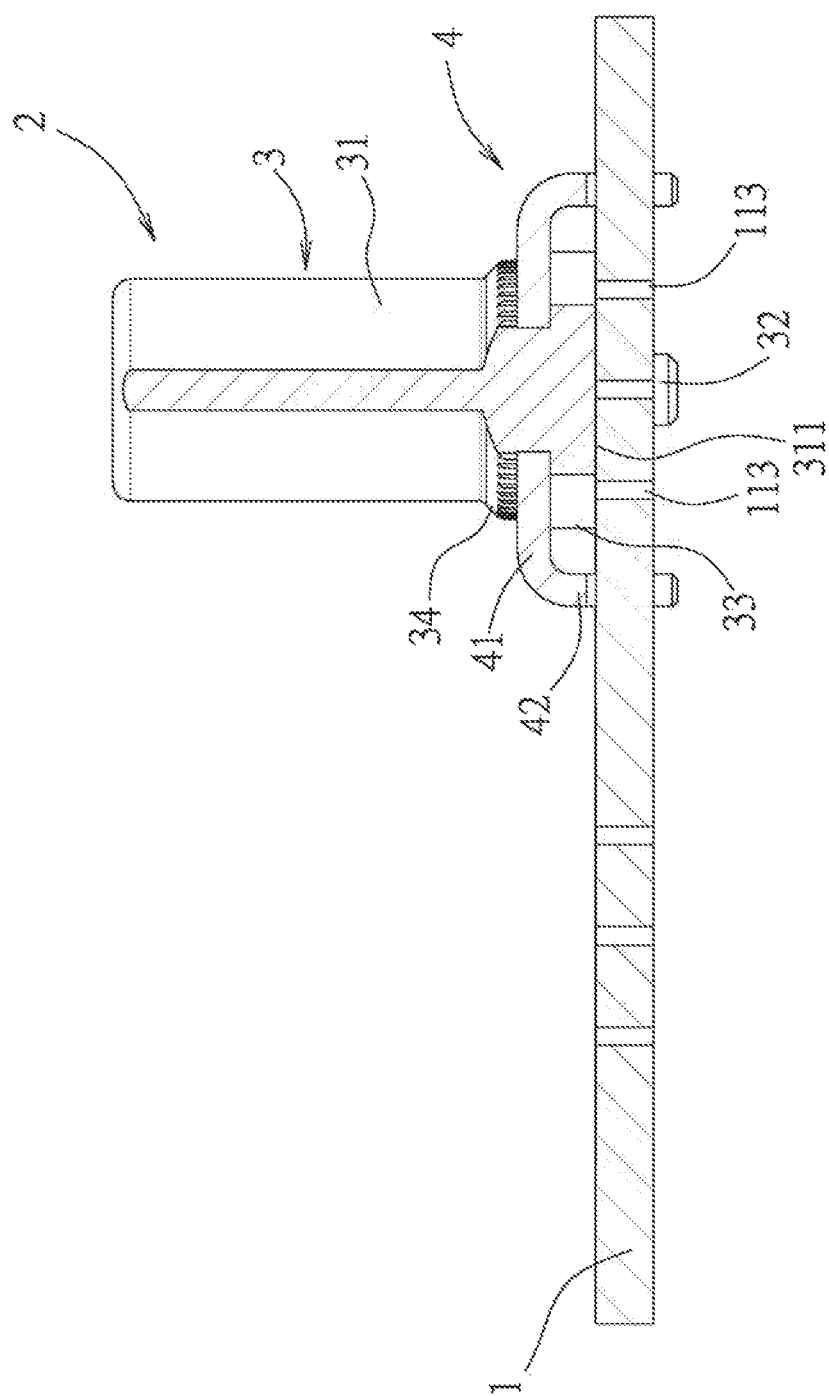
FIG. 8 is cross sectional view taken along a line VIII-VIII of FIG. 6.

Referring to FIG. 3 to FIG. 5, each high-current connector 2 comprises a conductive mating member 3 and a conductive combined shunt 4. The conductive mating member 3 may be integrally made of a conductive metal material and has a main body 31 and one alignment soldering leg 32. The main body 31 has a bottom surface 311, a top surface 313 opposite to the bottom surface 311 and a central axis A passing through the bottom surface 311 and the top surface 313, and the main body 31 is formed as an axisymmetric columnar body with respect to the central axis A. In the illustrated embodiment, the main body 31 is a cylinder; in a varied embodiment, the main body 31 may be a regular polygon column, such as a regular quadrilateral, a regular hexagonal and the like. The alignment soldering leg 32 integrally extends from the bottom surface 311 along the central axis A and protrudes from the bottom surface 311. The conductive combined shunt 4 may be integrally made of a conductive metal material and has a base portion 41 combined with the main body 31 and a plurality of shunt pins 42 extending downwardly from at least two opposite sides of the base portion 41, and the plurality of shunt pins 42 are symmetrically positioned at both sides of the alignment soldering leg 32. In the illustrated embodiment, the mating member 3 further has a ring flange 33 adjacent to the bottom surface 311 and integrally protruding outwardly from the main body 31 in a radial direction and an annular engaging portion 34 adjacent to the ring flange 33 and integrally protruding outwardly from the main body 31 in the radial direction and positioned between the ring flange 33 and the top surface 313. The base portion 41 of the conductive combined shunt 4 has an engaging hole 411 which cooperates with the engaging portion 34 and into which the engaging portion 34 is inserted so that the conductive combined shunt 4 and the mating member 3 are engaged and fixed in interference fit. In the illustrated embodiment, the ring flange 33 connects with the bottom surface 311 so that a bottom of the ring flange 33 is coplanar with the bottom surface 311, and the ring flange 33 connects with the engaging portion 34, and an outer diameter of the ring flange 33 is larger than an outer diameter of the engaging portion 34, so that a portion of the ring flange 33 protruding from the engaging portion 34 can prevent the base portion 41 of the conductive combined shunt 4 from moving toward the bottom surface 311. Further, the engaging portion 34 is formed as an annular comb. By that the engaging portion 34 is formed as the annular comb, the resistance to the engaging portion 34 during a process of the engaging portion 34 inserting into the engaging hole 411 and assembling and engaging with the base portion 41 can be reduced, so that assembling is easier and the interference engaging force between the engaging portion 34 and an inner edge of the engaging hole 411 defined by the base portion 41 can be increased. In addition, in the illustrated embodiment, the main body 31 further has a slot 312 recessed from the top surface 313 toward the bottom surface 311. The mating member 3 further has a plurality of elastic terminals 35 provided in the slot 312 of the main body 31 (also see FIG. 6 and FIG. 7), the plurality of elastic terminals 35 are generally arranged as a cage. And referring to FIG. 1, in the illustrated embodiment, the high-current connector 2 is in form of receptacle which is suitable for a mating connector 5 in form of plug to be inserted into the slot 312 to form an electrical connection. However, in a varied embodiment, the high-current connector 2 can also be in form of a plug without the slot 312 and the elastic terminals 35.

Referring to FIG. 1, FIG. 2, and FIG. 6 to FIG. 8, the circuit board 1 has at least two mounting regions 11, each mounting region 11 is provided with a middle conductive hole 111 and a plurality of first conductive holes 112 positioned on at least two sides of the middle conductive hole 111. The two high-current connectors 2 are respectively provided in the two mounting regions 11, and the alignment soldering leg 32 of each high-current connector 2 is inserted into and electrically connected to the middle conductive hole 111 of the corresponding mounting region 11, and the shunt pins 42 of each high-current connector 2 are respectively inserted into and electrically connected to the first conductive holes 112 of the corresponding mounting region 11. In the illustrated embodiment, the alignment soldering leg 32 and the shunt pins 42 are soldered and fixed with the circuit board 1 by soldering. The middle conductive hole 111 matches with the alignment soldering leg 32 in shape and size, and when the high-current connector 2 is mounted to the circuit board 1, the high-current connector 2 and the circuit board 1 can be positioned relative to each other by inserting the alignment soldering leg 32 into the middle conductive hole 111, thus it is convenient for the plurality of shunt pins 42 to align with and insert into the plurality of first conductive holes 112 respectively, so that the high-current connector 2 can be easily aligned and assembled on the circuit board 1. In the illustrated embodiment, each mounting region 11 is further provided with a plurality of second conductive holes 113 surrounding a periphery of the middle conductive hole 111 and positioned between the middle conductive hole 111 and the plurality of first conductive holes 112 and a conductive medium 114 provided on a surface of the mounting region 11. The plurality of second conductive holes 113 are electrically connected with the corresponding high-current connector 2 via the conductive medium 114. Specifically, the plurality of second conductive holes 113 can be electrically connected with at least one of the middle conductive hole 111 and the plurality of first conductive holes 112 via the conductive medium 114, therefore, after the alignment soldering leg 32 of the high-current connector 2 and the middle conductive hole 111 are soldered to form an electrical connection and the shunt pins 42 and the first conductive holes 112 are respectively soldered to form an electrical connection, the alignment soldering leg 32 and/or the shunt pins 42 are electrically connected with the plurality of second conductive holes 113 by the middle conductive hole 111 and/or the first conductive holes 112 which connect with the plurality of secondary conductive holes 113. Or, the plurality of the secondary conductive holes 113 can be electrically connected with the bottom surface 311 of the mating member 3 by the conductive medium 114. In the illustrated embodiment, the conductive medium 114 on the surface of each mounting region 11 electrically connects the middle conductive hole 111, the plurality of first conductive holes 112 and the plurality of second conductive holes 113 in the mounting region 11 together, therefore, the plurality of the second conductive holes 113 may form electrical connection with both the middle conductive hole 111 and the plurality of first conductive holes 112 via the conductive medium 114. Preferably, the plurality of secondary conductive holes 113 are also electrically connected with the bottom surface 311 of the mating member 3 via the conductive medium 114 in addition to form electrical connection with the middle conductive hole 111 and the plurality of first conductive holes 112 via the conductive medium 114. In an embodiment, the conductive medium 114 may be a conductive pad provided on the surface of the mounting region 11 in advance. In another embodiment, the conductive medium 114 may be a solder layer coated on the surface of the mounting region 11 during a soldering process. In still another embodiment, the conductive medium 114 may be a combination of a conductive pad provided on the surface of the mounting region 11 in advance and a solder layer coated on the surface of the conductive pad during a soldering process, which all can reach the effect of electrically connecting the plurality of conductive holes 113 with the corresponding high-current connector 2. In the illustrated embodiment, inner walls which define respective conductive holes 111, 112, 113 are respectively formed with conductive layers, and the circuit board 1 is a multilayer circuit board 1, and each layer of the multilayer circuit board 1 is provided with different conductive traces (not shown) to respectively connect with the plurality of conductive holes 111, 112, 113, the shunt paths of the high-current connector 2 can be further increased via the plurality of the second conductive holes 113 so as to increase the multiple-path distribution of current.

In conclusion, the high-current connector 2 and the circuit board 1 can be positioned relative to each other by inserting the alignment soldering leg 32 in the middle conductive hole 111, thus it is convenient to for the plurality of shunt pins 42 to align with and insert into the plurality of first conductive holes 112 respectively, so that the high-current connector 2 can be easily aligned and assembled on the circuit board 1. The shunt paths of the high-current connector 2 can be further increased via the plurality of the second conductive holes 113 so as to increase the multiple-path distribution of current.

However, what have been described above are only embodiments of the present disclosure, which cannot be used to limit the implementation scope of the present disclosure, and the simple equivalent variations and modifications made according to the scope of the disclosure and the description content of the present disclosure are still covered by the scope of the present disclosure.

The invention claimed is:

1. A high-current connector, comprising:
   a conductive mating member having a main body and one alignment soldering leg, the main body formed as a columnar body and having a bottom surface and a top surface opposite to the bottom surface, the alignment soldering leg integrally extending from the bottom surface and protruding from the bottom surface; and
   a conductive combined shunt having a base portion combined with the main body and a plurality of shunt pins extending from at least two opposite sides of the base portion, and the plurality of shunt pins being positioned on both sides of the alignment soldering leg.

2. The high-current connector of claim 1, wherein the main body further has a central axis passing through the bottom surface and the top surface and is formed as an axisymmetric columnar body with respect to the central axis, the alignment soldering leg integrally extends from the bottom surface along the central axis.

3. The high-current connector of claim 2, wherein
the conductive mating member further has a ring flange adjacent to the bottom surface and integrally protruding outwardly from the main body in a radial direction and an engaging portion adjacent to the ring flange and integrally protruding outwardly from the main body in the radial direction and positioned between the ring flange and the top surface,
the base portion of the conductive combined shunt has an engaging hole which cooperates with the engaging portion and into which the engaging portion is inserted so that the conductive combined shunt and the conductive mating member are engaged and fixed in interference fit.

4. The high-current connector of claim 3, wherein the engaging portion is formed as an annular comb.

5. The high-current connector of claim 3, wherein the ring flange connects with the engaging portion, and an outer diameter of the ring flange is larger than an outer diameter of the engaging portion so that a portion of the ring flange protruding from the engaging portion can prevent the base portion of the conductive combined shunt from moving toward the bottom surface.

6. The high-current connector of claim 1, wherein the main body further has a slot recessed from the top surface toward the bottom surface, the conductive mating member further has a plurality of elastic terminals provided in the slot of the main body.

7. A high-current connection device, comprising:
a circuit board having at least two mounting regions, each mounting region being provided with a middle conductive hole and a plurality of first conductive holes positioned on at least two sides of the middle conductive hole; and
at least one group of high-current connectors, each group having two high-current connectors, each high-current connector comprising:
a conductive mating member having a main body and an alignment soldering leg, the main body being formed as a columnar body and having a bottom surface and a top surface opposite to the bottom surface, the alignment soldering leg integrally extending from the bottom surface and protruding from the bottom surface, and
a conductive combined shunt having a base portion combined with the main body and a plurality of shunt pins extending from at least two opposite sides of the base portion, and the plurality of shunt pins being positioned on both sides of the alignment soldering leg;
the two high-current connectors being respectively provided in the two mounting regions, and the alignment soldering leg of each high-current connector being inserted into and electrically connected to the middle conductive hole of the corresponding mounting region, and the shunt pins of each high-current connector being respectively inserted into and electrically connected to the first conductive holes of the corresponding mounting region.

8. The high-current connection device of claim 7, wherein each mounting region is further provided with a plurality of second conductive holes surrounding a periphery of the middle conductive hole and positioned between the middle conductive hole and the plurality of first conductive holes and a conductive medium provided on a surface of the mounting region, the plurality of second conductive holes are electrically connected with the corresponding high-current connector via the conductive medium.

9. The high-current connection device of claim 8, wherein the conductive medium comprises a conductive pad provided on the surface of the mounting region in advance.

10. The high-current connection device of claim 8, wherein the conductive medium comprises a solder layer coated on the surface of the mounting region during a soldering process.

11. The high-current connection device of claim 8, wherein the conductive medium comprises a conductive pad provided on the surface of the mounting region in advance and a solder layer coated on the surface of the conductive pad during a soldering process.

12. The high-current connection device of claim 8, wherein the conductive medium on the surface of each mounting region electrically connects the middle conductive hole, the plurality of first conductive holes and the plurality of second conductive holes in the mounting region together.

13. The high-current connection device of claim 7, wherein the main body of each high-current connector further has a central axis passing through the bottom surface and the top surface and is formed as an axisymmetric columnar body with respect to the central axis, the alignment soldering leg integrally extends from the bottom surface along the central axis.

14. The high-current connection device of claim 13, wherein
the conductive mating member of each high-current connector further has a ring flange adjacent to the bottom surface and integrally protruding outwardly from the main body in a radial direction and an engaging portion adjacent to the ring flange and integrally protruding outwardly from the main body in the radial direction and positioned between the ring flange and the top surface,
the base portion of the conductive combined shunt of each high-current connector has an engaging hole which cooperates with the engaging portion and into which the engaging portion is inserted so that the conductive combined shunt and the conductive mating member are engaged and fixed in interference fit.

15. The high-current connection device of claim 14, wherein the engaging portion of each high-current connector is formed as an annular comb.

16. The high-current connection device of claim 15, wherein the ring flange connects with the engaging portion, and an outer diameter of the ring flange is larger than an outer diameter of the engaging portion so that a portion of the ring flange protruding from the engaging portion can prevent the base portion of the conductive combined shunt from moving toward the bottom surface.

17. The high-current connection device of claim 7, wherein the main body of each high-current connector further has a slot recessed from the top surface toward the bottom surface, the conductive mating member further has a plurality of elastic terminals provided in the slot of the main body.

* * * * *